US011502680B2

United States Patent
Arakawa

(10) Patent No.: US 11,502,680 B2
(45) Date of Patent: Nov. 15, 2022

(54) POWER DOWN DETECTION CIRCUIT AND SEMICONDUCTOR STORAGE APPARATUS

(71) Applicant: Winbond Electronics Corp., Taichung (TW)

(72) Inventor: Kenichi Arakawa, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/238,183

(22) Filed: Apr. 22, 2021

(65) Prior Publication Data

US 2021/0351771 A1 Nov. 11, 2021

(30) Foreign Application Priority Data

May 7, 2020 (JP) .............................. JP2020-081775

(51) Int. Cl.
*G06F 1/24* (2006.01)
*H03K 17/22* (2006.01)
*H03F 3/217* (2006.01)
*G06F 1/3203* (2019.01)

(52) U.S. Cl.
CPC .............. *H03K 17/223* (2013.01); *G06F 1/24* (2013.01); *G06F 1/3203* (2013.01); *H03F 3/217* (2013.01)

(58) Field of Classification Search
CPC ......... G06F 1/24; G06F 1/3203; H03K 17/22; H03K 17/223
USPC ........................................ 327/142, 143, 185
See application file for complete search history.

(56) References Cited

U.S. PATENT DOCUMENTS

| 7,227,390 | B1 | 6/2007 | Bapat et al. |
| 7,293,188 | B2 | 11/2007 | Espinor et al. |
| 7,391,665 | B1 | 6/2008 | Maung et al. |
| 8,415,993 | B1 * | 4/2013 | Newman .................. H03L 5/00 327/143 |
| 2008/0158220 | A1 | 7/2008 | Huang et al. |

FOREIGN PATENT DOCUMENTS

CN        104601150        8/2018

OTHER PUBLICATIONS

"Office Action of Taiwan Counterpart Application", dated Jul. 13, 2021, p. 1-p. 4.

* cited by examiner

*Primary Examiner* — William Hernandez
(74) *Attorney, Agent, or Firm* — JCIPRNET

(57) ABSTRACT

A power down detection circuit and a semiconductor storage apparatus, which can adjust a power down detection level while suppressing temperature dependence, are provided. The power down detection circuit includes a BGR circuit, a trimming circuit, a resistance division circuit, and a comparator. The BGR circuit generates a reference voltage based on a supply voltage. The trimming circuit adjusts the reference voltage based on a trimming signal to generate a reference voltage for power down detection. The resistance division circuit generates an internal voltage lower than the supply voltage. The comparator detects that the internal voltage is lower than the reference voltage for power down detection and outputs a reset signal.

10 Claims, 8 Drawing Sheets

POWER DOWN DETECTION CIRCUIT AND SEMICONDUCTOR STORAGE APPARATUS

CROSS-REFERENCE TO RELATED APPLICATION

This application claims the priority benefit of Japan application serial no. 2020-081775, filed on May 7, 2020. The entirety of the above-mentioned patent application is hereby incorporated by reference herein and made a part of this specification.

BACKGROUND

Technical Field

The invention relates to a semiconductor storage apparatus such as a flash memory, etc., and particularly relates to detection of drop of a supply voltage (power down detection).

Description of Related Art

A NAND flash memory uses a fuse unit to save settings of voltages used for reading, programming, erasing, etc., and setting information such as user options, etc. The fuse unit is, for example, set in a storage region in a memory cell array that cannot be accessed by a user. When the power of the flash memory is turned on, serving as a power-on operation, the setting information is read from the fuse unit and loaded into an internal register. After the power-on operation is ended, a controller controls various operations based on the setting information held in the internal register.

In a busy mode of the flash memory, when a supply voltage VCC supplied from an external terminal drops due to noise, peak current consumption, etc., the device cannot operate accurately. In order to avoid such situation, the flash memory has a reset function of a power down detection circuit capable of detecting a drop in the supply voltage VCC.

As shown in FIG. 1, when a power down detection circuit 10 detects that the supply voltage VCC drops to a detection level, the power down detection circuit 10 outputs a reset signal PDDRST to an internal circuit 20 such as a central processing unit (CPU) or a logic circuit. After receiving the reset signal PDDRST, the internal circuit 20 executes a power down operation to stop an operation of a charge pump circuit, or reset the CPU or the logic circuit, etc.

FIG. 2 is a diagram illustrating a configuration of an existing power down detection circuit 10. The power down detection circuit 10 includes a band gap reference (BGR) circuit 30, which generates a reference voltage VREFI based on the supply voltage VCC; a trimming circuit 40, which generates a reference voltage VREF by adjusting the reference voltage VREFI based on a trimming signal TR_VREF; a resistance division circuit 50, which generates an internal voltage VCC_DIV at a node N by performing resistance division on the supply voltage VCC; and a comparator 60, which compares the reference voltage VREFI with the internal voltage VCC_DIV, and outputs the reset signal PDDRST of an L level when VCC_DIV<VREFI is detected.

When the supply voltage VCC drops to a power down detection level, it is detected that VREFI>VCC_DIV, and the comparator 60 outputs the reset signal PDDRST shifted to the L level. The detection circuit using the comparator 60 has a relatively simple structure to suppress current consumption in a standby mode, i.e., the reference voltage VRFI of the BGR circuit 30 is directly input to an inverting input terminal (−) of the comparator 60, and the internal voltage VCC_DIV is input to a non-inverting input terminal (+) of the comparator 60. In addition, the reference voltage VREF generated by the trimming circuit 40 is used as a reference voltage for peripheral circuits of the flash memory.

FIG. 3 is an example of the BGR circuit 30. The BGR circuit 30 includes a first current path and a second current path between the supply voltage VCC and the ground (GND), and the first current path includes a P channel metal oxide semiconductor (PMOS) transistor P1, a resistor R1, and a diode D1 connected in series. The second current path includes a PMOS transistor P2, a resistor R2, a resistor R, and a diode D2 connected in series (a current density of the diode D1 is n times than that of the diode D2), the BGR circuit 30 further includes a differential amplifier circuit AMP. An inverting input terminal (−) of the differential amplifier circuit AMP is connected to a node VN that connects the resistor R1 and the diode D1, and a non-inverting input terminal (+) is connected to a node VP that connects the resistor R2 and the resistor R, and an output terminal of the differential amplifier circuit AMP is connected to gates of the transistor P1 and the transistor P2 in common. The differential amplifier circuit AMP adjusts an output voltage in a manner that a forward voltage of the transistor Q1 is equal to a forward voltage of the transistor Q2 plus a voltage generated in the resistor R, and outputs the reference voltage VREFI from an output node.

The BGR circuit 30 generates the reference voltage VREFI not relying on variation of the supply voltage VCC or an operating temperature, but the reference voltage VREFI is varied due to manufacturing deviations of the BGR circuit 30. Therefore, the trimming circuit 40 uses the trimming signal TR_VREF stored in the fuse unit to adjust the reference voltage VREFI to generate the final reference voltage VREF and provides the same to the internal circuit.

FIG. 4 is an ideal operating waveform of the power down detection circuit 10. For example, the supply voltage VCC is 1.8V, the reference voltage VREFI of the BGR circuit 30 is 1.2V, and the power down detection level is 1.3V. When the supply voltage VCC drops at a time t1, the internal voltage VCC_DIV drops accordingly. When the supply voltage VCC drops to 1.3V at a time t2, the internal voltage VCC_DIV crosses the reference voltage VREFI, i.e., the comparator 60 detects that the internal voltage VCC_DIV is lower than the reference voltage VREFI, and the comparator 60 outputs the reset signal PDDRST shifted from an H level to the L Level.

When the power down detection level is too high than expected, since the power down is frequently detected due to the drop of the supply voltage VCC, which may cause repeated reset execution. On the contrary, when the power down detection level is too lower than expected, even if the supply voltage VCC drops, the power down is not detected, which may cause error operation. Therefore, it is required to adjust the power down detection level according to factors such as manufacturing deviations or operating conditions of the device. For example, in the configuration shown in FIG. 2, since the reference voltage VREFI is directly input to the input of the comparator 60, if the power down detection level is to be changed, the reference voltage VREFI of the BGR circuit 30 must be changed. For example, when the power down detection level is adjusted to 1.2V lower than 1.3V, the reference voltage VREFI of the BGR circuit 30 needs to be changed from 1.2V to 1.1V, and when the supply voltage VCC drops to 1.2V, the comparator 60 detects that the internal voltage VCC_DIV is lower than the reference voltage VREFI.

However, changing the reference voltage VREFI of the BGR circuit 30 may cause temperature dependence of the comparator 60. The BGR circuit 30 is designed in a way of balancing negative temperature characteristics generated by a diode or a transistor and positive temperature characteristics generated by a resistor, so that the reference voltage VREFI does not have temperature dependence. Therefore, in the BGR circuit, for example, when a resistance is changed to arbitrarily change the reference voltage VREFI, the reference voltage VREFI has temperature dependence.

FIG. 5 is a diagram illustrating temperature dependence of the reference voltage, which is an example of a circuit design in which 1.2V is generated as the reference voltage VREFI. It may be seen that if the reference voltage VREFI is 1.2V, the voltage is almost flat from a low temperature to a high temperature, and there is almost no temperature dependence. However, when the reference voltage VREFI is lower than 1.2V, a positive temperature dependence of resistance becomes weaker, as a result, the reference voltage VREFI has a negative temperature dependence. Therefore, a detection level of the comparator 60 directly inputted with the reference voltage VREFI has temperature dependence, as a result, the power down detection level is different when the operating temperature is low and when the operating temperature is high, resulting in unstable operation of the power down detection.

SUMMARY

The invention resolves the above existing problem, and is directed to a power down detection circuit and a semiconductor storage apparatus capable of suppressing temperature dependence while adjusting a power down detection level.

The invention provides a power down detection circuit including a reference voltage generating circuit, which generates a temperature-compensated reference voltage based on a supply voltage; a generating circuit, which adjusts the reference voltage to generate a reference voltage for power down detection that is lower than the reference voltage; an internal voltage generating circuit, which generates a first internal voltage lower than the supply voltage; and a first detection circuit, which detects that the first internal voltage is lower than the reference voltage for power down detection.

The invention provides a semiconductor storage apparatus including the aforementioned power down detection circuit; and an execution component, which executes a power down operation in response to a detection result of the first detection circuit of the power down detection circuit.

According to the invention, the reference voltage for power down detection is generated based on the temperature-compensated reference voltage, so that the temperature dependence is suppressed while the power down detection level is adjusted.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 6:
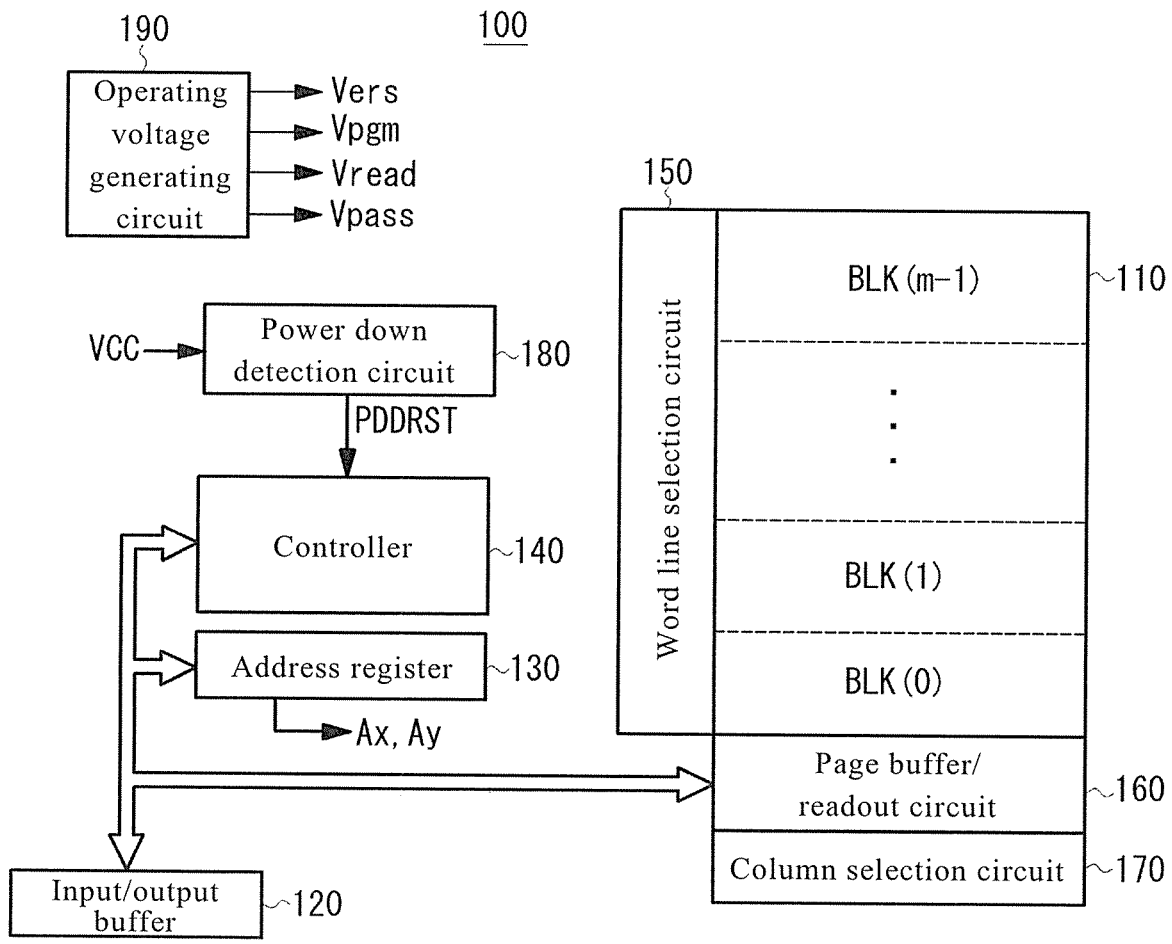
FIG. 6 is a frame diagram of an internal configuration of a flash memory according to an embodiment of the invention.

Then, embodiments of the invention are described in detail below with reference to the drawings. A semiconductor storage apparatus of the invention may be applied to a non-volatile memory such as a NAND type or NOR type flash memory, a resistance variable memory, a magnetic variable memory, etc., or a microprocessor, a microcontroller, logic, an application specific integrated circuit (ASIC), a processor that process images or sounds, a processor that process wireless signals, etc., that is embedded in the above non-volatile memory. In the following description, a NAND type flash memory is taken as an example for description FIG. 6 is a schematic configuration of a flash memory according to an embodiment of the invention. The flash memory 100 of the embodiment includes: a memory cell array 110 with a plurality of memory cells arranged in a matrix; an input/output buffer 120, which is connected to an external input/output terminal I/O; an address register 130, which receives address data from the input/output buffer 120; a controller 140, which receives command data from the input/output buffer 120 to control each part; a word line selection circuit 150, which performs block selection and word line selection based on a decoding result of row address information Ax coming from the address register 130; a page buffer/readout circuit 160, which holds data read from a page selected by the word line selection circuit 150, or holds data to be programmed to the selected page; a column selection circuit 170, which selects a column based on a decoding result of column address information Ay coming from the address register 130; a power down detection circuit 180, which monitors a supply voltage VCC supplied to a power terminal, and outputs a reset signal PDDRST when detecting that the supply voltage VCC drops to a detection level; and an operating voltage generating circuit 190, which generates various voltages (a programming voltage Vpgm, a pass voltage Vpass, a reading voltage Vread, an erasing voltage Vers, etc.) required for various operations such as reading, programming, erasing, etc., of data.

The memory cell array 110 has m blocks BLK(0), BLK(1), . . . , BLK(m−1) arranged in a column direction. A plurality of NAND strings are formed in one block, and one NAND string is formed by connecting a plurality of memory cells (for example, 64), a bit line side selection transistor, and a source line side selection transistor in series. A drain of the bit line side selection transistor is connected to a corresponding bit line, and a source of the source line side selection transistor is connected to a common source line. The NAND string may be formed two-dimensionally on a substrate surface or three-dimensionally on the substrate surface. In addition, the memory cell may be either a single level cell (SLC) type that stores one bit, or a multi-level cell (MLC) type that stores multiple bits.

In a reading operation, a certain positive voltage is applied to the bit line, a certain voltage (for example, 0V) is applied to a selected word line, and a pass voltage Vpass (for example, 4.5V) is applied to a non-selected word line, so that the bit line side selection transistor and the source line side selection transistor are turned on, and 0V is applied to the common source line. During a programming operation, a high-voltage programming voltage Vpgm (15V-20V) is applied to the selected word line, and an intermediate potential (for example, 10V) is applied to the non-selected word line, so that the bit line side selection transistor is turned on, and the source line side selection transistor is turned off, and a potential corresponding to data "0" or "1" is supplied to the bit line. During the erasing operation, 0V is applied to the selected word line in the block, and a high voltage (for example, 20V) is applied to a P well.

When the power down detection circuit 180 detects that the supply voltage VCC drops to a power down detection level, the power down detection circuit 180 outputs the reset signal PDDRST that is shifted from an H level to an L level to the controller 140. In response to the reset signal PDDRST, the controller 140 executes a power down operation according to a code read from a read only memory (ROM)/random access memory (RAM). In the power down operation, for example, operations such as resetting of an internal circuit of the controller 140, or stopping of a charge pump circuit included in the operating voltage generating circuit 190, etc., are performed.

Figure 1:
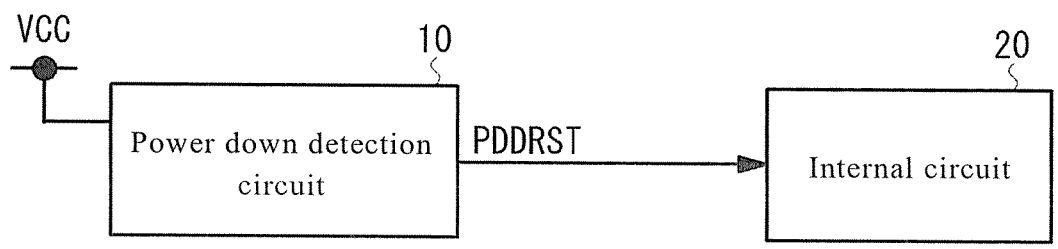
FIG. 1 is a diagram of a power down detection operation of a flash memory.
Figure 2:
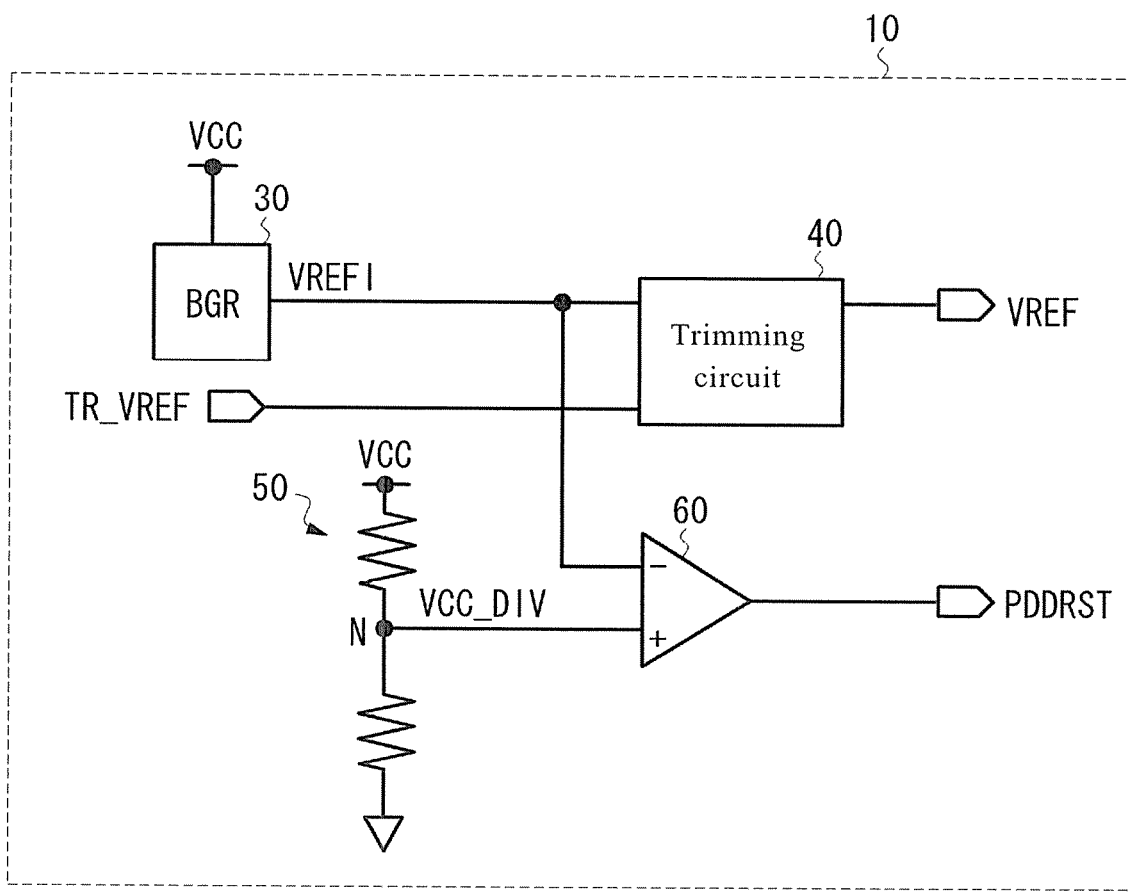
FIG. 2 is a diagram illustrating a configuration of an existing power down detection circuit.
Figure 3:
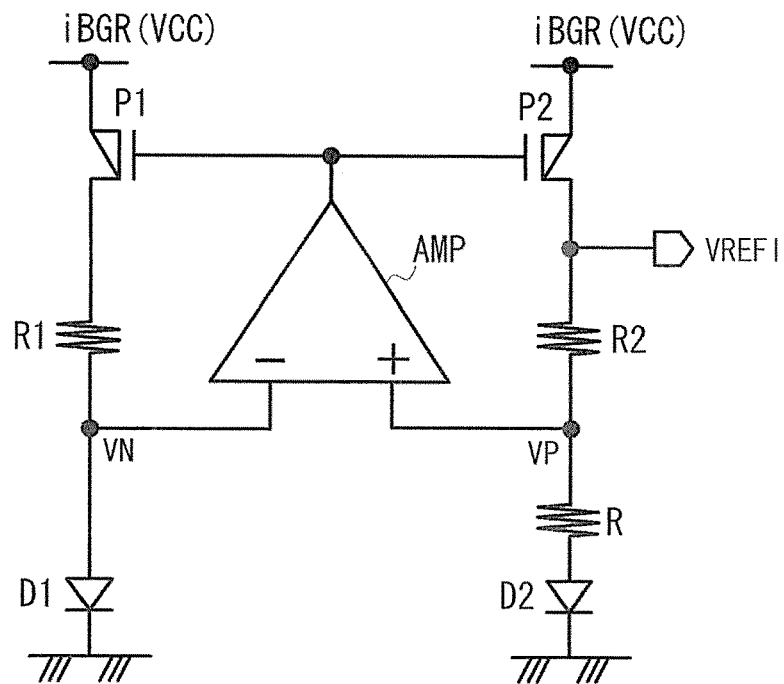
FIG. 3 is a diagram of a general configuration of a BGR circuit.
Figure 4:
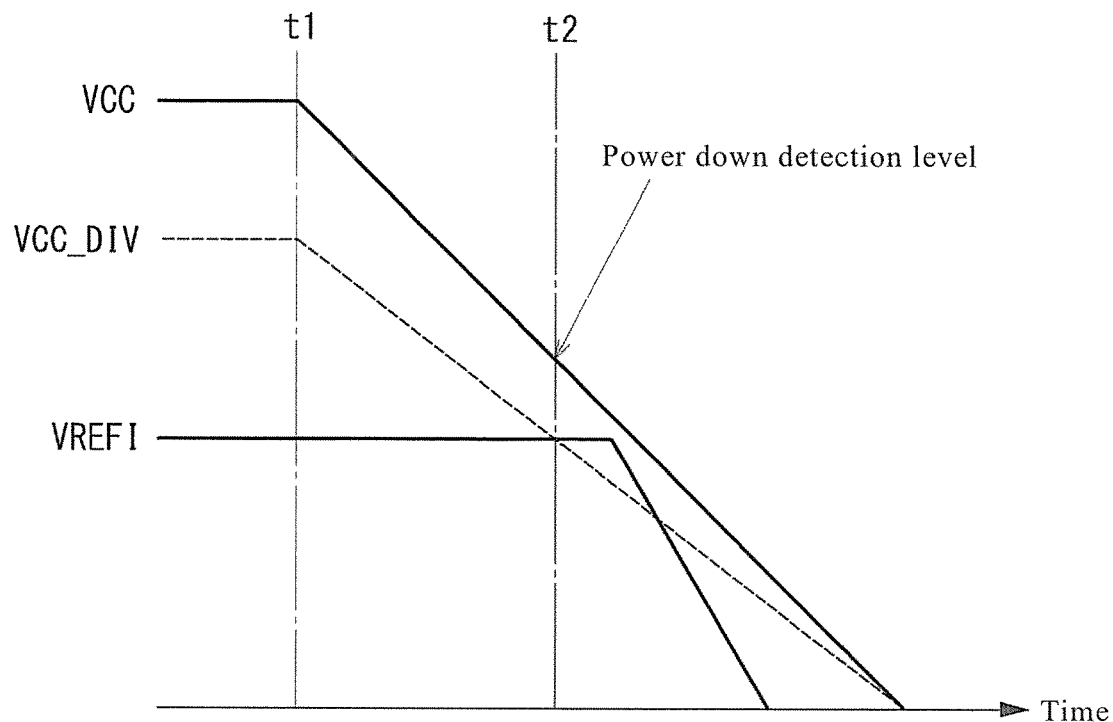
FIG. 4 is an ideal operating waveform of the existing power down detection circuit.
Figure 7:
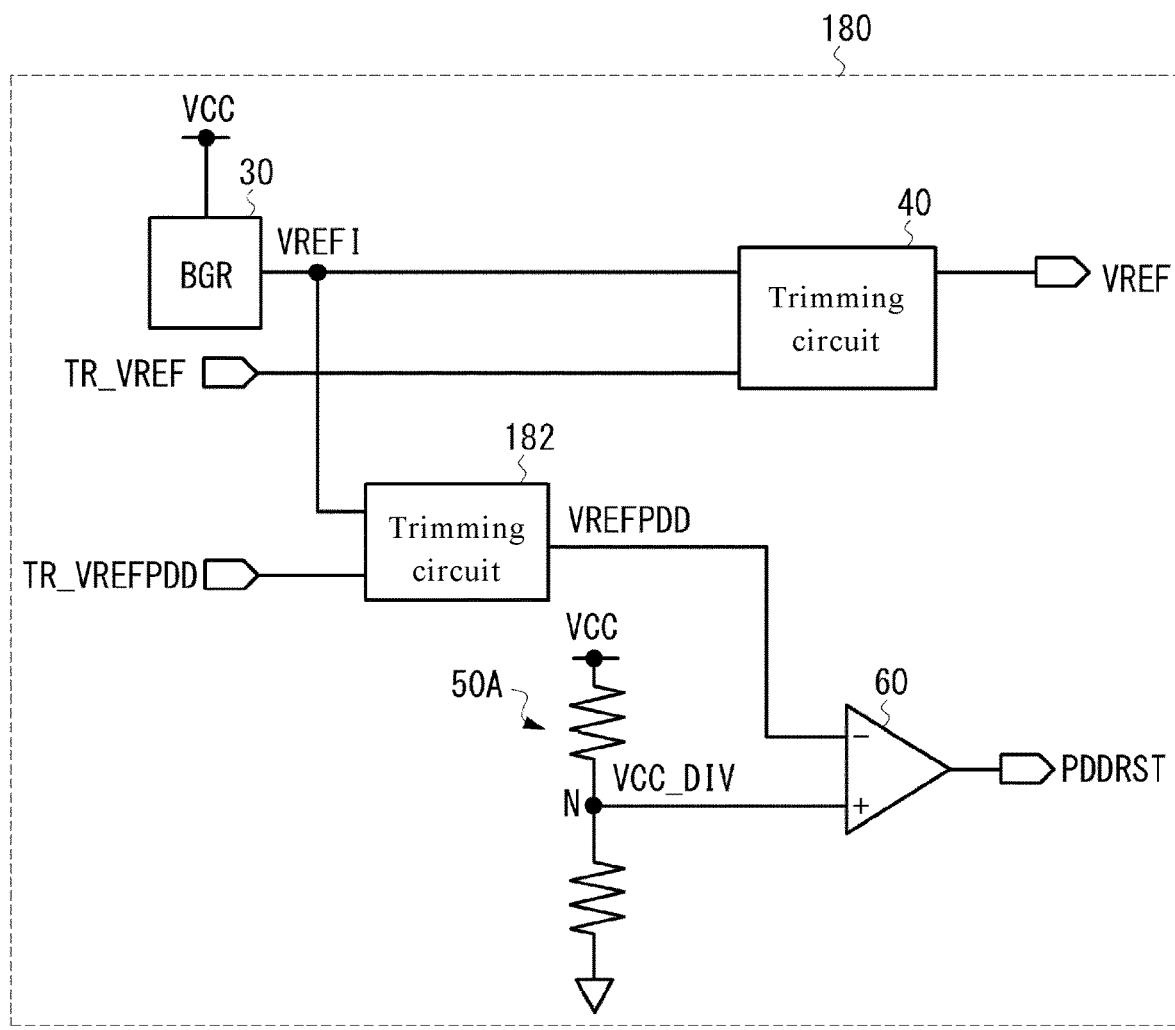
FIG. 7 illustrates a configuration of a power down detection circuit according to a first embodiment of the invention.

FIG. 7 illustrates an internal structure of the power down detection circuit 180 according to a first embodiment of the invention. In FIG. 7, the same components as those of the power down detection circuit 10 shown in FIG. 2 are denoted by the same reference numerals. The power down detection circuit 180 of the embodiment not only includes the configuration shown in FIG. 2 but also includes a trimming circuit 182, and the trimming circuit 182 generates a reference voltage VREFPDD for power down detection (which is referred to as a reference voltage for PD detection hereinafter) based on the reference voltage VREFI of the BGR circuit 30. The trimming circuit 182 adjusts the reference voltage VREFI based on a trimming signal TR_VREFPDD for power down detection (which is referred to as a trimming signal for PD detection hereinafter) to generate the reference voltage for PD detection VREFPDD (VREFPDD<VREFI) with suppressed temperature dependence. In addition, a resistance division circuit 50A includes a resistance ladder connected between the supply voltage VCC and GND, and generates an internal voltage VCC_DIV at a node N by performing resistance division on the supply voltage VCC. In the embodiment, the reference voltage for PD detection VREFPDD, which is lower than the reference voltage VREFI, is used for power down detection. Therefore, when the supply voltage VCC drops to the power down detection level, the internal voltage VCC_DIV is adjusted so that the comparator 60 detects that VCC_DIV<VREFPDD.

Figure 8:
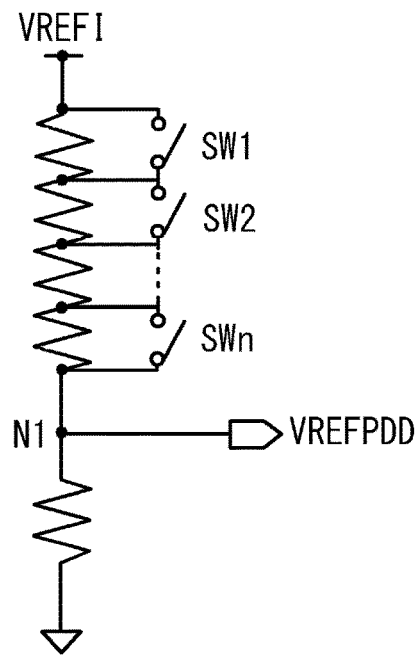
FIG. 8 is a diagram of an example of a trimming circuit of the embodiment.

The trimming circuit 182 is not particularly limited, but includes, for example, a digital analog converter (DAC) (a variable resistor) that generates an analog voltage corresponding to the trimming signal for PD detection TR_VREFPDD. FIG. 8 is an example of the trimming circuit 182. A switch SW1 and a switch SW2 to a switch SWn are connected between a plurality of taps of the resistance ladder connected between the reference voltage VREFI and GND. The trimming signal for PD detection TR_VREFPDD includes a trim code (for example, 3 bits), and one or more switches SW1-SWn selected by using the trim code are turned on to output the reference voltage for PD detection VREFPDD from the output node N1.

Particularly, the reference voltage VREFI supplied to the trimming circuit 182 is a temperature-compensated voltage generated by the BGR circuit 30, and is a voltage with suppressed temperature dependence. Then, by generating the reference voltage for PD detection VREFPDD based on the reference voltage VREFI, the temperature dependence of the reference voltage for PD detection VREFPDD may be suppressed, and the comparator 60 may perform power down detection without temperature dependence. The trimming signal for PD detection TR_VREFPDD and a trimming signal TR_VREF that is input to the trimming circuit 40 for adjusting the reference voltage VREF are all saved in a fuse memory of the memory cell array 110, and these trimming signals are read out to a register of the controller 140 from the fuse memory during a power-on operation or a power-on detection.

Figure 9:
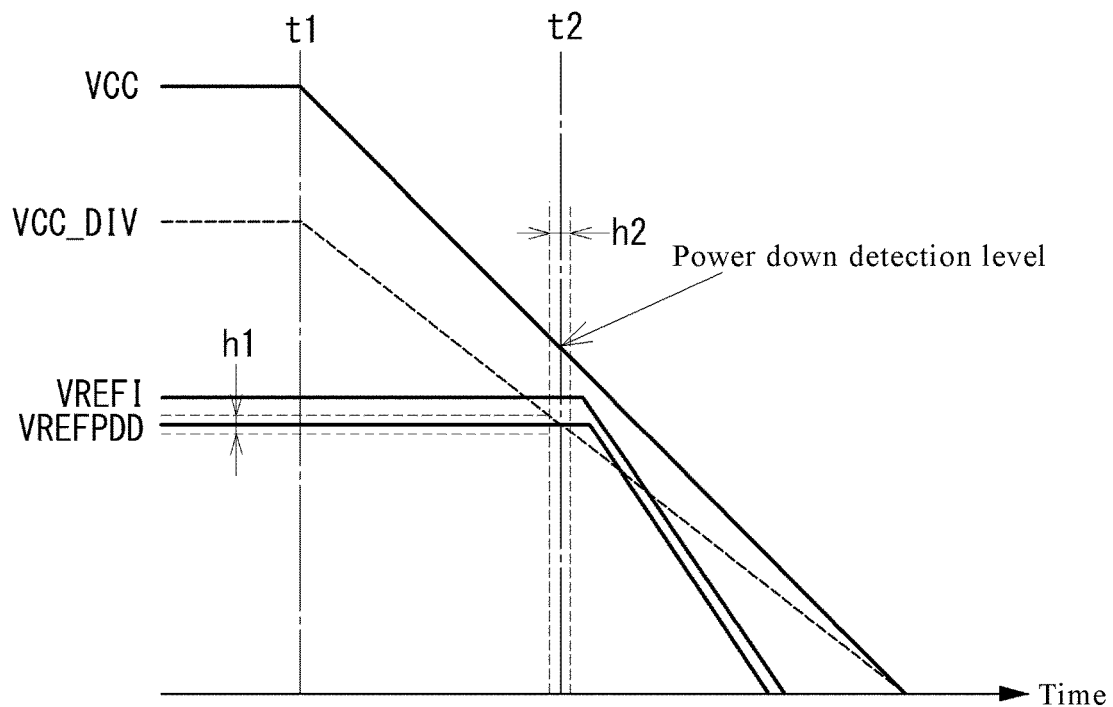
FIG. 9 is a diagram of operation waveforms of a power down detection circuit according to the first embodiment of the invention.

FIG. 9 illustrates operation waveforms of a power down detection circuit of the embodiment. When the supply voltage VCC drops due to certain factors such as noise or a peak current, etc., at a time t1, the internal voltage VCC_DIV obtained by performing resistance division on the supply voltage VCC also drops similarly. When the supply voltage VCC reaches the power down detection level at a time t2, the comparator 60 detects that the internal voltage VCC_DIV is lower than the reference voltage for PD detection VREFPDD (VCC_DIV<VREFPDD), and outputs the reset signal PDDRST shifted to the L level. A range h1 of the reference voltage for PD detection VREFPDD indicated by dotted lines represents a range where the trimming signal for PD detection TR_VREFPDD may be used to adjust the reference voltage for PD detection, and a range h2 of the power down detection level indicated by dotted lines represents an adjustable range of the power down detection level corresponding to the adjustment range of the reference voltage for PD detection VREFPDD. For example, when the supply voltage VCC is 1.8V and the reference voltage VREFI is 1.2V, the power down detection level may be changed from 1.3V to 1.2V through adjusting the reference voltage for PD detection VREFPDD to 1.1V.

Figure 5:
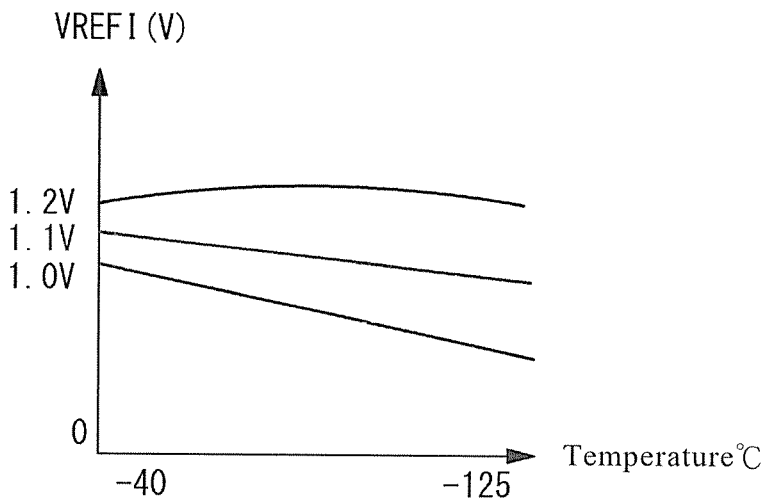
FIG. 5 is a diagram illustrating temperature dependence of a reference voltage of the BGR circuit.
Figure 10A:
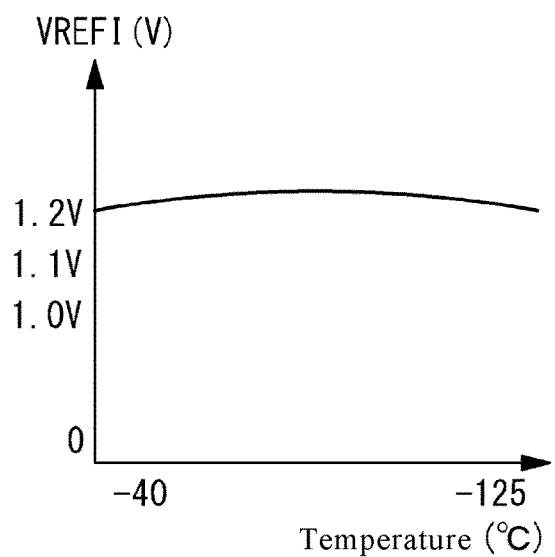
FIG. 10(A) and FIG. 10(B) are diagrams of temperature dependence of the power down detection circuit according to the first embodiment of the invention.
Figure 10B:
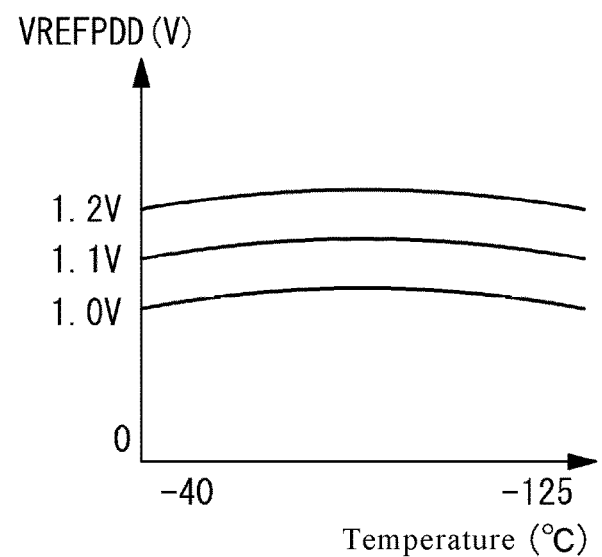

FIG. 10(A) illustrates temperature dependence of the reference voltage VREFI, and FIG. 10(B) illustrates temperature dependence of the reference voltage for PD detection VREFPDD. The reference voltage VREFI (for example, 1.2V) generated by the BGR circuit 30 is a temperature-compensated voltage. The reference voltage for PD detection VREFPDD obtained by adjusting the reference voltage VREFI is still a voltage with suppressed temperature dependence. As shown in FIG. 5, the reference voltage VREFI changed to 1.1V or 1.0V has temperature dependence. Comparatively, as shown in FIG. 10(B), the temperature dependence of the reference voltage for PD detection VREFPDD adjusted to 1.1V or 1.0V is suppressed. Thus, the comparator 60 may perform stable power down detection without relying on the operating temperature. In addition, the trimming circuit 182 is independent to the trimming circuit 40 and is provided for the purpose of power down detection, so that it may individually adjust the power down detection level without being restricted by the trimming circuit 40.

Then, a second embodiment of the invention is described below. When the BGR circuit 30 is operated at a low voltage due to a drop of the supply voltage VCC, it may output a voltage lower than the expected reference voltage VREFI. For example, when designing to generate the reference voltage VREFI of 1.2V, if the supply voltage VCC drops to the power down detection level of about 1.3V, the reference voltage VREFI may be lower than 1.2V. Therefore, even though the supply voltage VCC drops to the power down detection level, the comparator 60 cannot detect that VCC_DIV<VREFPDD, and the reset operation cannot be properly executed.

Figure 12A:
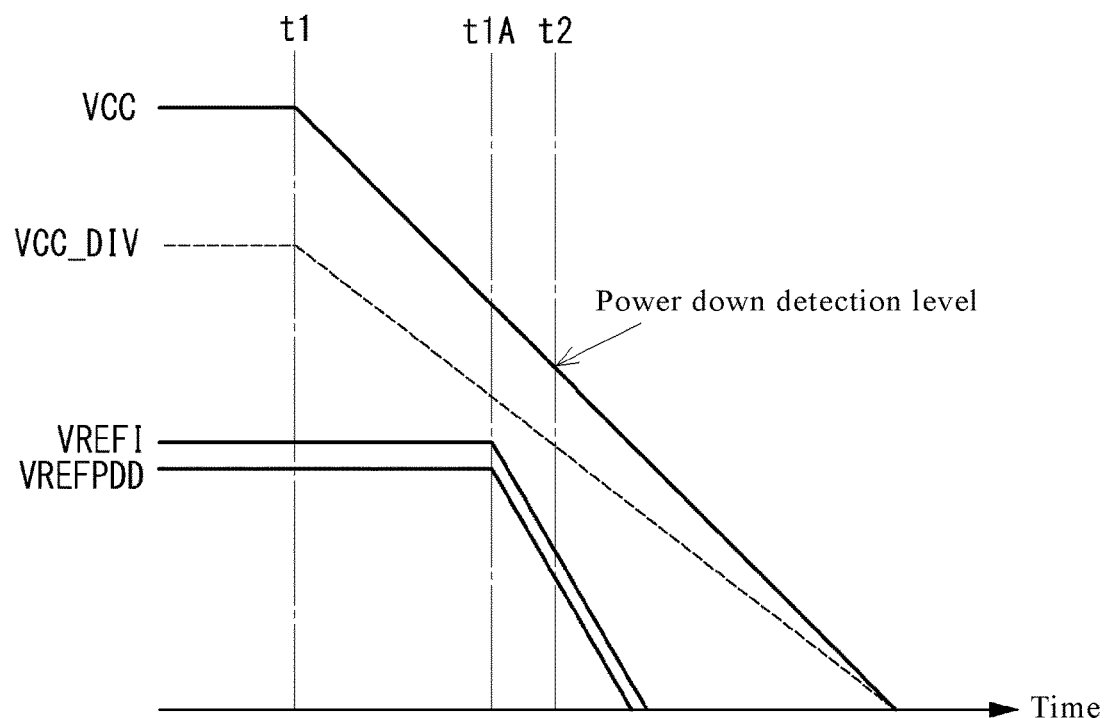
FIG. 12(A) is a diagram of operation waveforms of the power down detection circuit when a reference voltage of the BGR circuit drops.

The above situation is shown in FIG. 12 (A). At a time t1, the supply voltage VCC drops, and the internal voltage VCC_DIV drops accordingly. At a time t2, the supply voltage VCC drops to the power down detection level. At a time t1A before the time t2, the operation of the BGR circuit 30 is unstable, the reference voltage VREFI starts to drop, and meanwhile the reference voltage for PD detection VREFPDD also drops. As a result, at the time t2, the reference voltage for PD detection VREFPDD does not cross the internal voltage VCC_DIV, and the drop of the internal voltage VCC_DIV cannot be detected.

Figure 11:
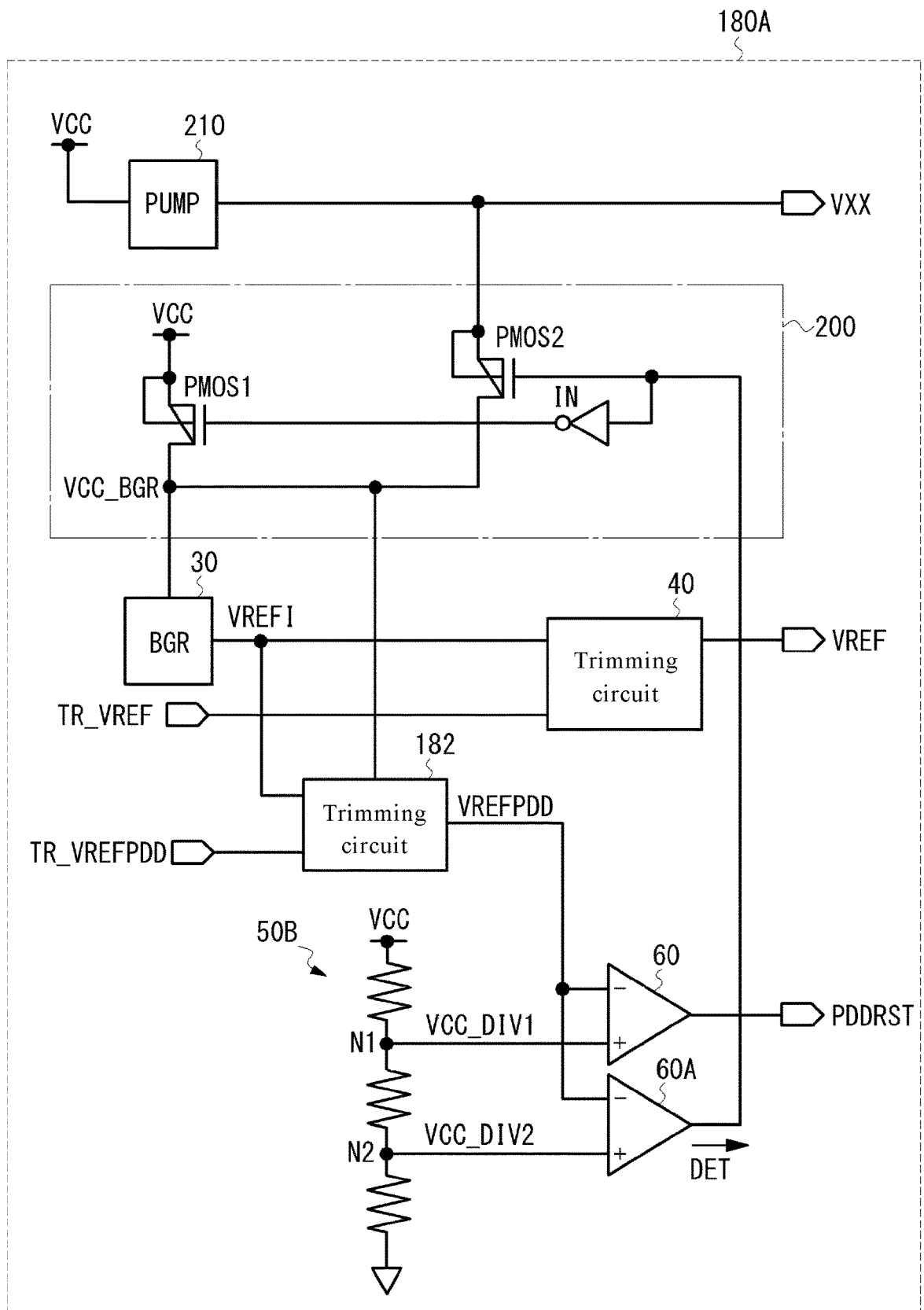
FIG. 11 is a diagram of a configuration of a power down detection circuit according to a second embodiment of the invention.

The second embodiment resolves the above situation. FIG. 11 is a configuration of a power down detection circuit 180A according to the second embodiment of the invention, and the same components as that of FIG. 7 are denoted by the same reference numerals. The power down detection circuit 180A of the embodiment further includes: a comparator 60A, which detects a situation that the supply voltage VCC drops to a certain level; a switching circuit 200, which switches the voltage supplied to the BGR circuit 30 from the supply voltage VCC to a boosted voltage VXX based on a detection result of the comparator 60A; and a boost circuit 210, which generates the boosted voltage VXX obtained by boosting the supply voltage VCC. The boost circuit 210 includes, for example, a charge pump circuit, and the boost circuit 210 may be used for operations such as reading, programming, and erasing of the flash memory 100, and may also be exclusively provided in the power down detection circuit 180A.

A resistance division circuit 50B of the embodiment generates a first internal voltage VCC_DIV1 at a node N1, and further generates a second internal voltage VCC_DIV2 at a node N2. The first internal voltage VCC_DIV1 is the same as the internal voltage VCC_DIV of the first embodiment. The second internal voltage VCC_DIV2 is a voltage used to detect a situation that the supply voltage VCC drops to a certain level before the supply voltage VCC drops to the power down detection level, and has a relationship of VCC_DIV2<VCC_DIV1. In the comparator 60A, the reference voltage for PD detection VREFPDD is compared with the second internal voltage VCC_DIV2, and when VCC_DIV2<VREFPDD is detected, a detection signal DET shifted to the L level is output.

The switching circuit 200 includes: a P-type transistor PMOS1, which is connected between the supply voltage VCC and a voltage supply node VCC_BGR of the BGR circuit 30; a P-type transistor PMOS2, which is connected between an output of the boost circuit 210 and the voltage supply node VCC_BGR; and an inverter IN, which is inputted with the detection signal DET output from the comparator 60A. An output of the inverter IN is applied to a gate of the transistor PMOS1, and the detection signal DET is applied to a gate of the transistor PMOS2. During the period of VCC_DIV2>VREFPDD, the comparator 60A outputs the detection signal DET of the H level. During this period, the transistor PMOS1 is turned on, the transistor PMOS2 is not turned on, and the supply voltage VCC is supplied to the BGR circuit 30. When the comparator 60A detects that VCC_DIV2<VREFPDD, the detection signal DET is shifted to the L level, the transistor PMOS1 is not turned on, the transistor PMOS2 is turned on, and the BGR circuit 30 is supplied with the boosted voltage VXX generated by the boost circuit 210.

Figure 12B:
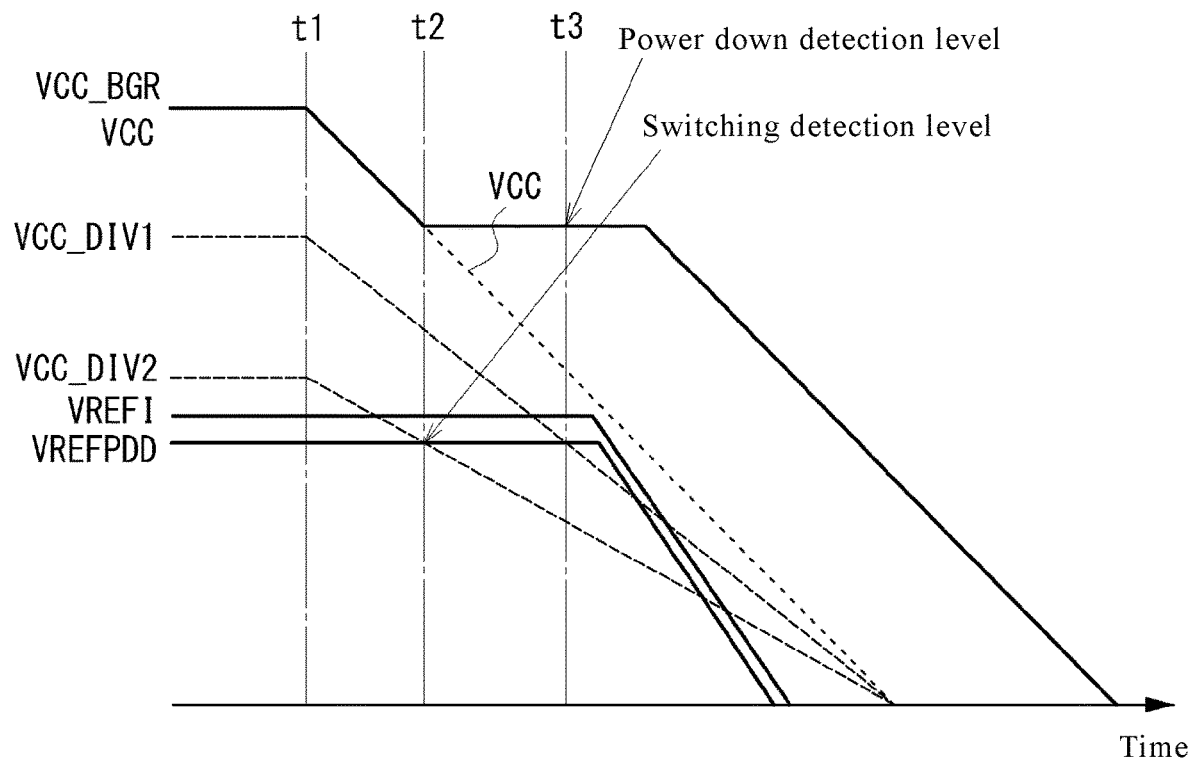
FIG. 12(B) is a diagram of operation waveforms of the power down detection circuit according to the second embodiment of the invention.

FIG. 12(B) illustrates an operation waveform of the power down detection circuit of the embodiment. When the supply voltage VCC drops at the time t1, the voltage of the voltage supply node VCC_BGR, the first internal voltage VCC_DIV1, and the second internal voltage VCC_DIV2 also drop accordingly. When the supply voltage VCC drops to a switching detection level at the time t2, the comparator 60A detects that VCC_DIV2<VREFPDD, and outputs the detection signal DET shifted from the H level to the L level. The switching circuit 200 turns off the transistor PMOS1 and turns on the transistor PMOS2 in response to the detection signal DET, thereby supplying the boosted voltage VXX to the voltage supply node VCC_BGR. Then, even if the supply voltage VCC drops further (indicated by dotted lines), the voltage of the voltage supply node VCC_BGR (indicated by a solid line) is charged by the boosted voltage VXX and does not drop immediately, but remains at a certain level for a certain period of time. By suppressing the drop in the voltage of the voltage supply node VCC_BGR, during the period, the operation of the BGR circuit 30 is stable, and the expected reference voltage VREFI is generated, and the trimming circuit 180 also generates the expected reference voltage for PD detection VREFPDD.

When the supply voltage VCC drops to the power down detection level at a time t3, the comparator 60 detects that VCC_DIV1<VREFPDD, and outputs the reset signal PDDRST shifted from the H level to the L level.

In summary, according to the embodiment, the boosted voltage VXX is used to ensure the operation of the BGR circuit 30 when the supply voltage VCC drops, so that the drop in the reference voltage VREFI is suppressed, and it is indeed detected that the supply voltage VCC reaches the power down detection level.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:
1. A power down detection circuit, comprising:
  a reference voltage generating circuit, generating a temperature-compensated reference voltage based on a supply voltage;

a generating circuit, adjusting the reference voltage to generate a reference voltage for power down detection that is lower than the reference voltage;

an internal voltage generating circuit, generating a first internal voltage lower than the supply voltage; and a first detection circuit, detecting that the first internal voltage is lower than the reference voltage for power down detection, wherein the generating circuit generates the reference voltage for power down detection based on a trimming signal prepared in advance.

2. The power down detection circuit as claimed in claim 1, wherein the reference voltage generating circuit comprises a band gap reference circuit.

3. The power down detection circuit as claimed in claim 1, further comprising:

a second detection circuit, detecting that a second internal voltage lower than the first internal voltage is lower than the reference voltage for power down detection; and a switching circuit, switching the supply voltage applied to the reference voltage generating circuit to a boosted voltage generated by a boost circuit based on a detection result of the second detection circuit.

4. The power down detection circuit as claimed in claim 3, wherein the second internal voltage is generated by the internal voltage generating circuit.

5. The power down detection circuit as claimed in claim 3, wherein the second detection circuit comprises a comparator that compares the second internal voltage with the reference voltage for power down detection.

6. The power down detection circuit as claimed in claim 1, wherein the trimming signal is read from a non-volatile storage circuit and is supplied to the generating circuit when power is turned on.

7. The power down detection circuit as claimed in claim 1, wherein the first detection circuit comprises a comparator that compares the first internal voltage with the reference voltage for power down detection.

8. A semiconductor storage apparatus, comprising:

the power down detection circuit as claimed in claim 1; and an execution component, executing a power down operation in response to a detection result of the first detection circuit of the power down detection circuit.

9. The semiconductor storage apparatus as claimed in claim 8, wherein the power down operation comprises a circuit reset.

10. The semiconductor storage apparatus as claimed in claim 8, wherein the reference voltage generated by the reference voltage generating circuit is adjusted through different trimming circuits, and the adjusted reference voltage is supplied to an internal circuit.

* * * * *